United States Patent
Hong et al.

(10) Patent No.: US 11,782,432 B2
(45) Date of Patent: Oct. 10, 2023

(54) METHOD AND SYSTEM FOR CONTROLLING LOT RISK SCORE BASED DYNAMIC LOT MEASUREMENT ON BASIS OF EQUIPMENT RELIABILITY INDEX

(71) Applicant: SK HOLDINGS CO., LTD., Seoul (KR)

(72) Inventors: Tae Young Hong, Seongnam-si (KR); Jin Woo Park, Hwaseong-si (KR)

(73) Assignee: SK HOLDINGS CO., LTD., Seoul (KR)

( * ) Notice: Subject to any disclaimer, the term of this patent is extended or adjusted under 35 U.S.C. 154(b) by 54 days.

(21) Appl. No.: 16/622,097

(22) PCT Filed: May 25, 2018

(86) PCT No.: PCT/KR2018/005943
§ 371 (c)(1),
(2) Date: Dec. 12, 2019

(87) PCT Pub. No.: WO2018/230853
PCT Pub. Date: Dec. 20, 2018

(65) Prior Publication Data
US 2021/0191382 A1    Jun. 24, 2021

(30) Foreign Application Priority Data
Jun. 14, 2017  (KR) .................. 10-2017-0074579

(51) Int. Cl.
*G05B 23/02*    (2006.01)
*G05B 19/4065*  (2006.01)
(Continued)

(52) U.S. Cl.
CPC ......... *G05B 23/0283* (2013.01); *G01R 31/26* (2013.01); *G05B 19/4065* (2013.01);
(Continued)

(58) Field of Classification Search
CPC ............ G05B 23/0283; G05B 23/0259; G05B 23/0221; G05B 19/4065;
(Continued)

(56) References Cited

U.S. PATENT DOCUMENTS

| 2009/0306803 A1 | 12/2009 | Behm et al. |
| 2017/0109646 A1* | 4/2017 | David ................. H01L 22/12 |
| 2018/0267523 A1* | 9/2018 | Sigtermans ........ G05B 23/0243 |

FOREIGN PATENT DOCUMENTS

| CA | 2510294 C | * 3/2008 | ....... G05B 19/41805 |
| JP | 11-345752 A | 12/1999 | |

(Continued)

OTHER PUBLICATIONS

R. C. Elliott and et al, "Sampling plan optimization for detection of lithography and etch CD process excursions", Microlithography 2000, 2000, Santa Clara, CA, United States (Year: 2000).*

(Continued)

*Primary Examiner* — Douglas Kay
(74) *Attorney, Agent, or Firm* — Sughrue Mion, PLLC

(57) ABSTRACT

A method and a system for controlling a lot risk score based dynamic lot measurement on the basis of equipment reliability index are provided. The method for controlling a measurement, according to an embodiment of the present invention, calculates an equipment reliability index of specific equipment for a specific process in semiconductor manufacturing, calculates a risk score of the specific equipment for the specific process on the basis of an equipment reliability index, and determines, on the basis of the risk score, whether to measure a semiconductor product processed by the specific equipment for the specific process. Therefore, differential quality monitoring and management is possible according to the equipment reliability index, a measuring instrument can be efficiently used, quality and yield can be improved through timely measurement, and (Continued)

Equipment Reliability Index = Process Stability (Sop) × Equipment Stability (Seq)

Lot Risk Score = 1 - Equipment Reliability Index × Lot Risk Excursion (Lex)

management convenience can be increased through automatic and dynamic lot measurement control.

8 Claims, 4 Drawing Sheets

(51) Int. Cl.
    *G01R 31/26*     (2020.01)
    *H01L 21/67*     (2006.01)
    *H01L 21/02*     (2006.01)

(52) U.S. Cl.
    CPC ..... *G05B 23/0221* (2013.01); *G05B 23/0259* (2013.01); *H01L 21/02* (2013.01); *H01L 21/67276* (2013.01); *H01L 21/67* (2013.01)

(58) Field of Classification Search
    CPC ........... G05B 2219/45031; G05B 2219/50185; G01R 31/26; H01L 21/67; H01L 21/67276; Y02P 90/02; G06F 17/10
    See application file for complete search history.

(56) References Cited

FOREIGN PATENT DOCUMENTS

| | | | | |
|---|---|---|---|---|
| JP | H11345752 A | * | 12/1999 | ............. H01L 21/02 |
| JP | 2002-373014 A | | 12/2002 | |
| JP | 2008-235303 A | | 10/2008 | |
| JP | 2010-118562 A | | 5/2010 | |
| JP | 2010118562 A | * | 5/2010 | |
| JP | 4736613 B2 | | 7/2011 | |
| KR | 10-2011-0101761 A | | 9/2011 | |
| KR | 10-2012-0042528 A | | 5/2012 | |
| KR | 20120042528 A | * | 5/2012 | |
| WO | 2012/029500 A1 | | 3/2012 | |
| WO | WO-2012029500 A1 | * | 3/2012 | .......... G06F 11/3409 |
| WO | WO-2017203556 A1 | * | 11/2017 | ............... G06F 9/50 |

OTHER PUBLICATIONS

V. E. Kane, "Process Capability Indices", Journal of Quality Technology, vol. 18, No. 1, Jan. 1986 (Year: 1986).*
A. Bousetta and A.J. Cross, "Adaptive Sampling Methodology for In-Line Defect Inspection", 2005 IEEE/SEMI Advanced Semiconductor Manufacturing Conference (Year: 2005).*
International Search Report for PCT/KR2018/005943 dated Aug. 29, 2018.
Korean Office Action for 10-2017-0074579 dated Nov. 30, 2018.
Communication dated Dec. 17, 2020 from the Japanese Patent Office in Application No. 2019-565924.
Communication dated Mar. 23, 2022, issued by the Chinese Patent Office in counterpart Chinese Application No. 201880038342.9.

* cited by examiner

METHOD AND SYSTEM FOR CONTROLLING LOT RISK SCORE BASED DYNAMIC LOT MEASUREMENT ON BASIS OF EQUIPMENT RELIABILITY INDEX

TECHNICAL FIELD

The present disclosure relates to semiconductor measurement-related technology, and more particularly, to a method and a system for controlling lot measurement during semiconductor manufacturing.

BACKGROUND ART

In semiconductor manufacturing, measurement may be performed to monitor whether there is a quality problem in a process or equipment. However, all products are not measured for an entire measurement period and some of the products are selected for measurement only according to a specified measurement period.

In some cases, engineers may decide to measure manually. For example, when there is a change in manufacturing/technology, such as a change in equipment, materials, or processes, when a process or equipment does not meet specifications and thus an alarm is raised, or when manufacturing is interrupted, engineers may decide to measure manually.

Measurement performed at fixed periods may not be optimal since there is no consideration for quality of a process or equipment, and manual measurement by engineers may be performed only under special circumstances.

DISCLOSURE

Technical Problem

The present disclosure has been developed in order to address the above-discussed deficiencies of the prior art, and an object of the present disclosure is to provide a method and a system for dynamically controlling lot risk score-based lot measurement on the basis of an equipment reliability index of specific equipment for a specific process in semiconductor manufacturing.

Technical Solution

According to an embodiment of the present disclosure to achieve the above-described object, a measurement control method includes: calculating an equipment reliability index of specific equipment for a specific process in semiconductor manufacturing; calculating a risk score of the specific equipment for the specific process, on the basis of the equipment reliability index; and determining whether to measure a semiconductor product which is processed in the specific equipment for the specific process, on the basis of the risk score.

In addition, the calculating the equipment reliability index may include: calculating a process stability for the specific process; calculating an equipment stability for the specific equipment; and calculating the equipment reliability index by an arithmetic operation using the process stability and the equipment stability.

In addition, the equipment reliability index may be calculated by using the following equation:

$$\text{Equipment reliability index} = \text{Process stability} \times \text{Equipment stability}$$

In addition, the calculating the process stability may include calculating the process stability ($S_{op}$) by using the following equation:

$$S_{op} = \text{Min}(Cpk, 1)$$

$$Cpk = \text{Min}\{(USL-m)/3\sigma, (m-LSL)/3\sigma\}$$

Min: Minimum value of listed values
M: Target value on process specifications
USL: Upper specification limit
LSL: Lower specification limit
σ: Standard deviation In addition, the calculating the equipment stability may include calculating the equipment stability on the basis of a frequency of occurrence of fault detection and classification (FDC) interlock during a specific period.

In addition, the measurement control method according to an embodiment of the present disclosure may further include calculating an excursion of the risk score, and the calculating the risk score may include calculating the risk score on the basis of the equipment reliability index and the excursion.

In addition, the excursion may have a value changed according to a number of semiconductor products processed after measurement.

In addition, the calculating the excursion may include calculating the excursion by an arithmetic operation using the number of semiconductor products processed after measurement and a reference measurement period.

In addition, the reference measurement period may be an average measurement period which is calculated by using a number of semiconductor products processed during a specific period, and a number of measured semiconductor products.

The calculating the risk score may include calculating the risk score by using the following equation:

$$\text{Risk score} = 1 - \text{Equipment reliability index} \times \text{Excursion}$$

In addition, the determining may include determining to measure when the risk score reaches a reference value.

In addition, the calculating the equipment reliability index may include calculating the equipment reliability periodically, and the calculating the risk score and the determining may include calculating and determining in real time whenever a semiconductor product is processed in the specific equipment.

According to another embodiment of the present disclosure, a measurement control system includes: an obtaining unit configured to obtain data regarding specific equipment for a specific process in semiconductor manufacturing; and a processor configured to calculate an equipment reliability index of the specific equipment for the specific process by using the obtained data, to calculate a risk score of the specific equipment for the specific process, on the basis of the equipment reliability index, and to determine whether to measure a semiconductor product which is processed in the specific equipment for the specific process, on the basis of the risk score.

Advantageous Effects

According to embodiments of the present disclosure as described above, it is possible to dynamically control lot measurement based on a lot risk score on the basis of an equipment reliability index of specific equipment for a specific process in semiconductor manufacturing. Therefore, lot measurement is frequently performed when the equipment reliability index is low, and lot measurement is intermittently performed when the equipment reliability index is high, such that differential quality monitoring/management according to the equipment reliability index is possible.

Accordingly, according to embodiments of the present disclosure, a measurement device can be effectively used, quality/yield can be improved through timely measurement, and management convenience can be increased through automatic/dynamic lot measurement control.

BEST MODE

Hereinafter, the present disclosure will be described in detail with reference to the accompanying drawings.

Figure 1:
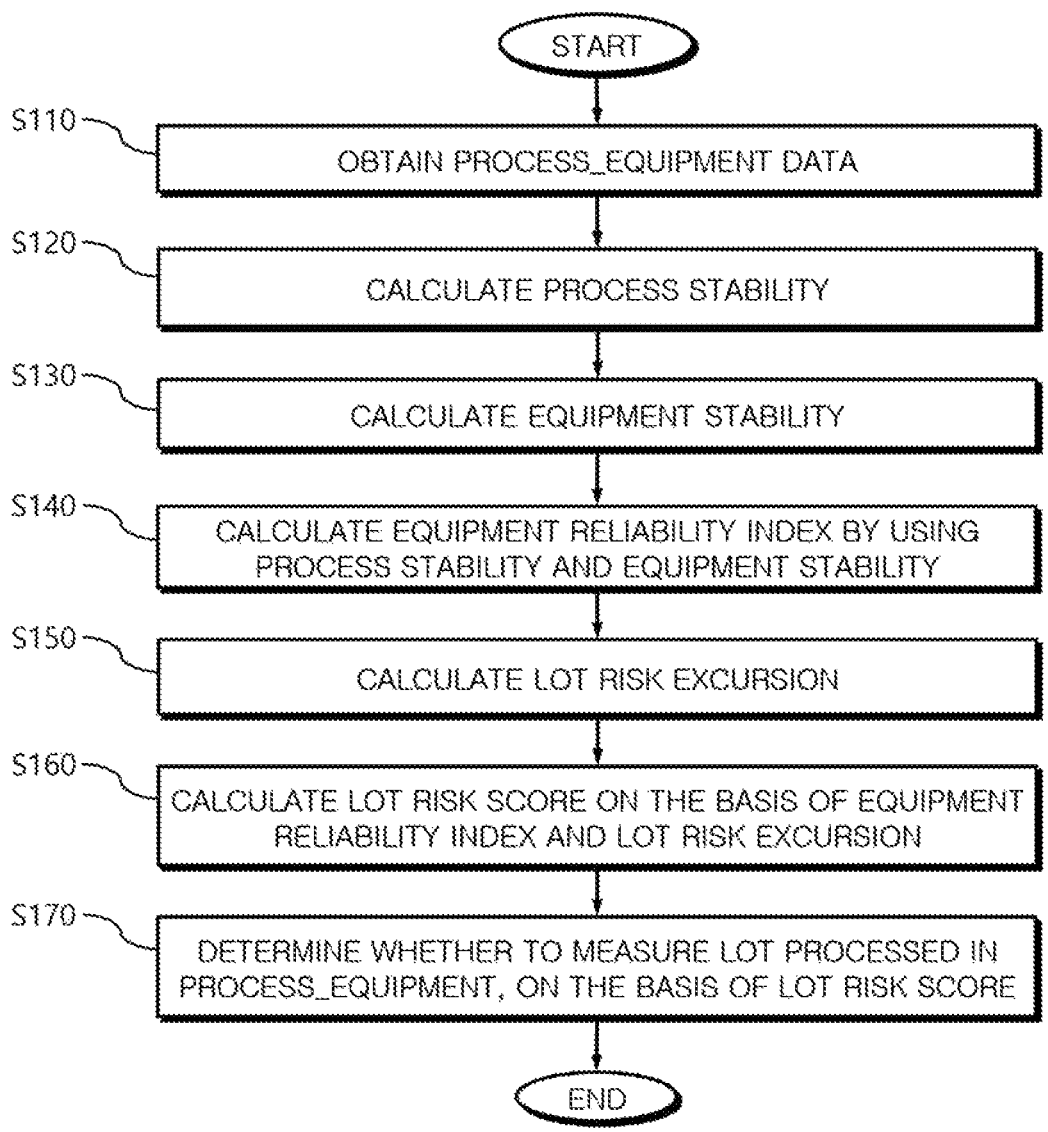
FIG. 1 is a flowchart provided to explain a method for dynamically controlling lot measurement according to an embodiment of the present disclosure.

FIG. 1 is a flowchart provided to explain a method for dynamically controlling lot measurement according to an embodiment of the present disclosure.

The method for dynamically controlling the lot measurement according to an embodiment of the present disclosure is a method for calculating a lot risk score on the basis of an equipment reliability index, and dynamically determining whether to measure a lot on the basis of the lot risk score.

Accordingly, it is dynamically determined whether a lot which is moved out of equipment is measured, and this determination is made with reference to a lot risk score based on an equipment reliability index.

The lot risk score is an index indicating a risk that a quality problem which may arise when a lot moved out of equipment is not measured is not recognized.

The method for dynamically controlling the lot measurement according to an embodiment of the present disclosure sets a lot risk score to be calculated high when the equipment reliability index is low, such that lot measurement is frequently performed. On the other hand, the method sets the lot risk score to be calculated low when the equipment reliability index is high, such that lot measurement is intermittently performed. Accordingly, it is possible to monitor/manage quality differently according to the equipment reliability index.

The method for dynamically controlling the lot measurement according to an embodiment of the present disclosure is separately performed according to a process and equipment. That is, the algorithm shown in FIG. 1 is performed separately for every specific equipment (for example, the third equipment from among 20 pieces of equipment for an etching process) (hereinafter, referred to as "process_equipment") for a specific process (for example, the etching process corresponding to the 11$^{th}$ process from among 100 processes).

In an embodiment of the present disclosure, it is assumed that a semiconductor product is measured on a lot basis, but this is merely an example, and embodiments in which the semiconductor product is measured in other units belong to the scope of the present disclosure.

The method shown in FIG. 1 is performed by a dynamic lot measurement control system (hereinafter, referred to as a "measurement control system"), which is a kind of a computing system.

As shown in FIG. 1, the measurement control system obtains process_equipment data necessary for calculating an equipment reliability index (S110). The data obtained in step S110 includes the following data regarding the process_equipment:

1) m: Target value on process specifications
2) USL (Upper Specification Limit)
3) LSL (Lower Specification Limit)
4) σ: Standard deviation
5) $L_{cnt}$: The number of lots which have been processed for the past two weeks
6) $L_{fdc}$: The number of times that fault detection and classification (FDC) interlock has occurred for the past two weeks
7) $L_{mes}$: The number of lots which have been measured for the past two weeks Next, the measurement control system calculates a process stability by using the data obtained in step S110 (S120). The process stability $S_{op}$ may be calculated according to the following Equation 1:

$$S_{op} = \text{Min}(Cpk, 1)$$

$$Cpk = \text{Min}\{(USL-m)/3\sigma, (m-LSL)/3\sigma\} \quad \text{[Equation 1]}$$

where Min is a minimum value from among listed values. Accordingly, the process stability $S_{op}$ has the maximum value of 1.

In addition, the measurement control system calculates an equipment stability by using the data obtained in step S110 (S130). The equipment stability $S_{eq}$ may be calculated by using the following Equation 2:

$$S_{eq} = \exp(-3 \times L_{fdc}/L_{cnt}) \quad \text{[Equation 2]}$$

According to Equation 2 above, it can be seen that the equipment stability $S_{eq}$ is determined according to the frequency of occurrence of the FDC interlock for the past two weeks.

Next, the measurement control system calculates an equipment reliability index by using the process stability $S_{op}$ calculated in step 120 and the equipment stability $S_{eq}$ calculated in step S130 (S140). The equipment reliability index may be calculated by using the following Equation 3:

$$\text{Equipment reliability index} = S_{op} \times S_{eq} \quad \text{[Equation 3]}$$

Thereafter, the measurement control system calculates a lot risk excursion (S150). The lot risk excursion $L_{ex}$ may be calculated by using the following Equation 4:

$$L_{ex} = \exp(-30 \times L_{m/o}/L_{avg}) \quad \text{[Equation 4]}$$

where $L_{m/o}$ is the number of lots which is processed after measurement in the process_equipment and is moved out. For example, when the 10$^{th}$ lot which is processed in the process_equipment and is moved out is measured and then the 11$^{th}$ lot, the 12$^{th}$ lot, and the 13$^{th}$ lot are processed in the process_equipment and are moved out, and then measurement is not performed, "$L_{m/o}=3$."

In addition, Lavg is an average ratio of the measured lot numbers over the total processed lot numbers for the past two weeks, and may be calculated according to the following Equation 5 by using the data obtained in step S110:

$$L_{avg} = L_{mes}/L_{cnt} \quad \text{[Equation 5]}$$

$L_{avg}$ may not be calculated according to Equation 5, and may be determined by a manager by considering equipment characteristics and a manufacturing environment. The equipment characteristics considered may include a degree of deterioration of equipment, and a past defect rate/accident history, and the manufacturing environment may include a quantity of products/manufacturing speed.

Next, the measurement control system calculates a lot risk score on the basis of the equipment reliability index calculated in step S140, and the lot risk excursion $L_{ex}$ calculated in step S150 (S160).

As described above, the lot risk score refers to an index indicating a risk that a quality problem which may arise when a lot moved out of equipment is not measured is not recognized. The lot risk score $L_{risk}$ may be calculated by using the following Equation 6:

$$L_{risk}=1-\text{Equipment reliability index}\times L_{ex}=1-S_{op}\times S_{eq}\times L_{ex}$$ [Equation 6]

The process stability $S_{op}$ has the maximum value of 1, and the equipment stability $S_{eq}$ which is an exp function and the lot risk excursion $L_{ex}$ have the maximum value of 1. Accordingly, variables forming the lot risk score $L_{risk}$ are expressed by normalized probability values (0-1), and the lot risk score $L_{risk}$ in Equation 6 above is calculated as a probability value (0-1).

Thereafter, the measurement control system determines whether to measure the lot which is processed in the process_equipment and is moved out, on the basis of the lot risk score calculated in step S160 (S170).

Specifically, when the lot risk score exceeds 0.95, the lot is measured, but, when the lot risk score is less than or equal to 0.95, the lot is not measured and measurement is skipped.

Figure 2:
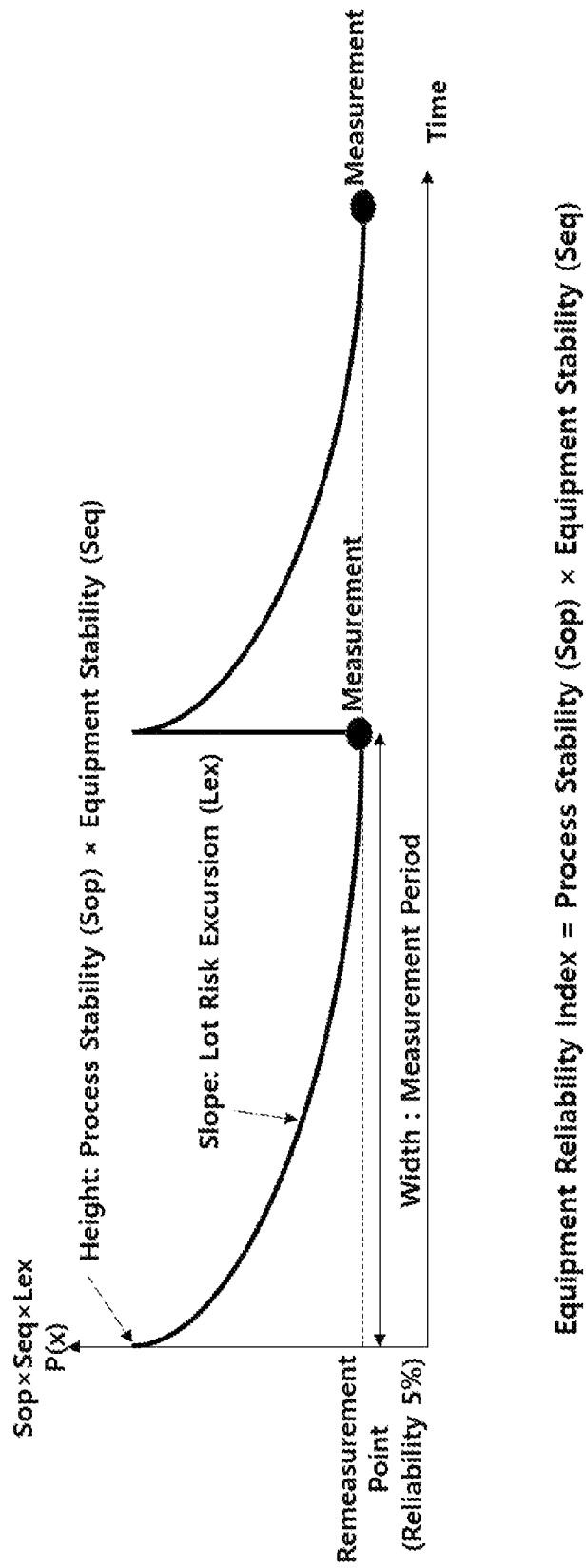
FIG. 2 is a view illustrating a curve of $S_{op} \times S_{eq} \times L_{ex}$.
Figure 3:
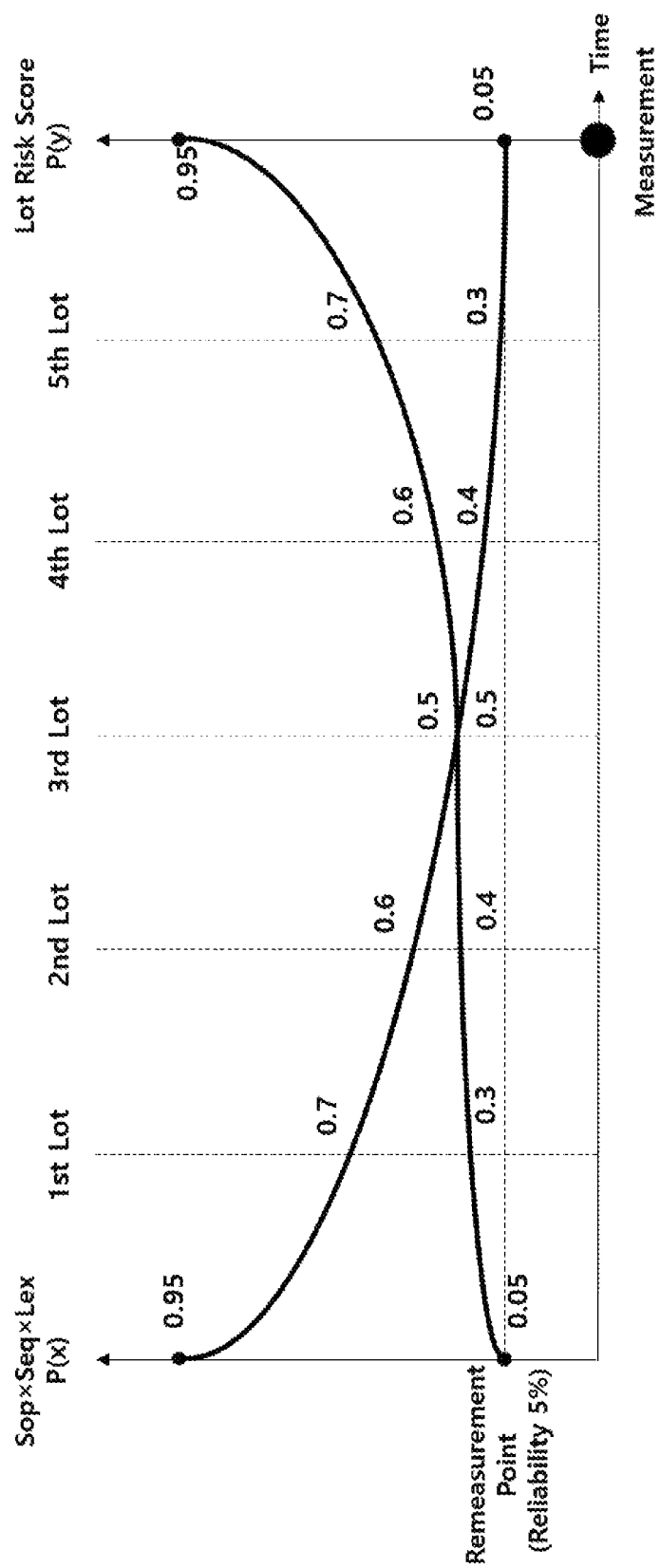
FIG. 3 is a view illustrating a lot risk score curve.

To explain in detail, FIG. 2 illustrates a curve of "$S_{op}\times S_{eq}\times L_{ex}$" and FIG. 3 illustrates a lot risk score curve.

As shown in FIG. 2, the height (maximum value) of $S_{op}\times S_{eq}\times L_{ex}=P(x)$ is determined by process stability ($S_{op}$)×equipment stability ($S_{eq}$), and the slope is determined by multiplication by the lot risk excursion ($L_{ex}$).

In addition, as shown in FIG. 3, the lot risk score curve P(y) is symmetrical to the curve $P(x)[=S_{op}\times S_{eq}\times L_{ex}]$ with reference to a point if y=0.5.

In addition, as shown in FIGS. 2 and 3, when the lot risk score P(y)=0.95, that is, when $P(x)[=S_{op}\times S_{eq}\times L_{ex}]=0.05$, the measurement is performed and $L_{m/o}$ becomes "0." Accordingly, P(y) becomes a minimum value and P(x) becomes a maximum value.

Up to now, the lot risk score-based dynamic lot measurement method on the basis of the equipment reliability index has been described with reference to preferred embodiments.

The dynamic lot measurement method according to an embodiment of the present disclosure includes the process of calculating the equipment reliability index (steps S110 to S140), and the process of calculating the lot risk score and dynamically measuring according thereto (steps S150 to S170).

The process of calculating the lot risk score and dynamically measuring on the basis thereof (steps S150 to S170) should be performed in real time whenever the lot is processed and is moved out of the process_equipment. However, the process of calculating the equipment reliability index (steps S110 to S140) may be performed at specific periods (for example, every 8 hours).

Figure 4:
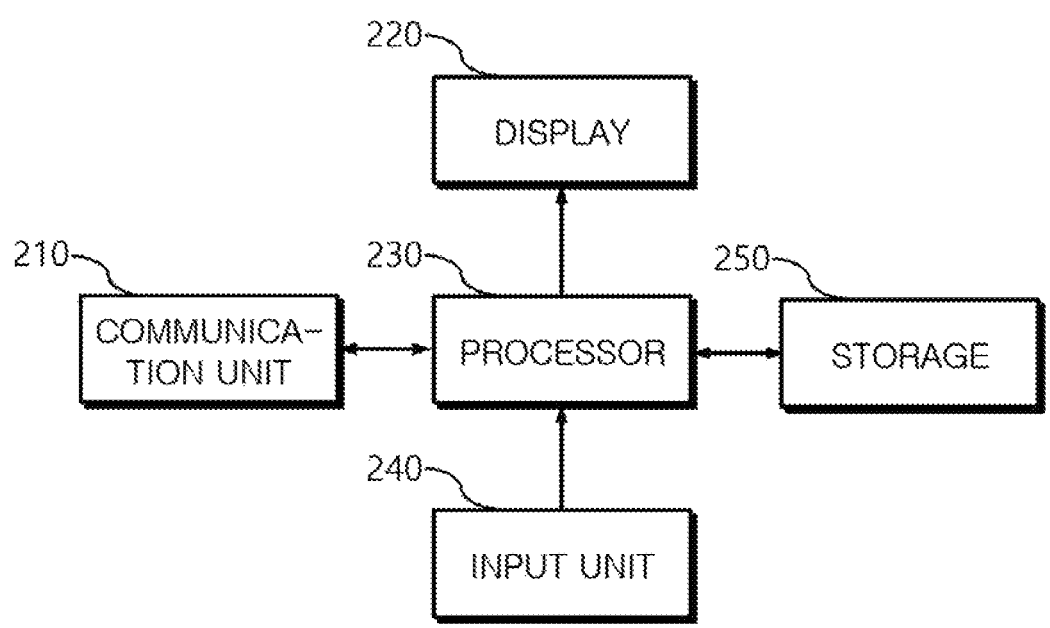
FIG. 4 is a block diagram of a measurement control system according to another embodiment of the present disclosure.

The measurement control system which performs the dynamic lot measurement control method according to an embodiment of the present disclosure will be described in detail with reference to FIG. 4. FIG. 4 is a block diagram of the measurement control system according to another embodiment of the present disclosure.

As shown in FIG. 4, the measurement control system according to an embodiment of the present disclosure includes a communication unit 210, a display 220, a processor 230, an input unit 240, and a storage 250.

The communication unit 210 is a means for connecting communication with an external device or an external network and communicating data, and obtains/extracts process_equipment data which is used for calculating an equipment reliability index and a lot risk excursion.

The display 220 is a means for displaying information, and displays a lot risk score, information regarding whether measurement is performed. The input unit 240 is a means for inputting information, and may be used to input process_equipment data and/or manager's settings.

The display 220 and the input unit 240 may be integrated into a touch screen, and this is more useful when the measurement control system is a mobile type.

Since the above-described process_equipment data may be received from process_equipment or a network through the communication unit 210, or may be inputted and collected through the input unit 240, the communication unit 210 and the input unit 240 may function as a data obtaining means.

The processor 230 may perform the dynamic lot measurement control algorithm shown in FIG. 1 by using the obtained process_equipment data, and may display a result of performing on the display 220 or may transmit the result to an external device/network through the communication unit 210.

The storage 250 provides a storage space which is necessary for the processor 230 to perform the dynamic lot measurement control algorithm.

The technical idea of the present disclosure may be applied to a computer-readable recording medium which records a computer program for performing functions of the apparatus and the method according to the present embodiment. In addition, the technical idea according to various embodiments of the present disclosure may be implemented in the form of a computer-readable code recorded on the computer-readable recording medium. The computer-readable recording medium may be any data storage device that can be read by a computer and can store data. For example, the computer-readable recording medium may be a read only memory (ROM), a random access memory (RAM), a CD-ROM, a magnetic tape, a floppy disk, an optical disk, a hard disk drive, or the like. A computer-readable code or program that is stored in the computer readable recording medium may be transmitted via a network connected between computers.

In addition, while preferred embodiments of the present disclosure have been illustrated and described, the present disclosure is not limited to the above-described specific embodiments. Various changes can be made by a person skilled in the art without departing from the scope of the present disclosure claimed in claims, and also, changed embodiments should not be understood as being separate from the technical idea or prospect of the present disclosure.

The invention claimed is:

1. A measurement control method for performing automatic and dynamic lot measurement control in semiconductor manufacturing, the method being performed by using a measurement device and a measurement control device including a communication unit and a processor configured to perform the measurement control method based on a dynamic lot measurement control algorithm, the method comprising:

obtaining, by using the measurement device, process and equipment data regarding a semiconductor manufacturing equipment for a semiconductor manufacturing process in semiconductor manufacturing, receiving the process and equipment data via the communication unit;

based on the received process and equipment data, calculating, by the processor, an equipment reliability index of the semiconductor manufacturing equipment for the semiconductor manufacturing process in the semiconductor manufacturing;

calculating, by the processor, a lot risk score excursion $L_{ex}$, calculating, by the processor, a lot risk score of the semiconductor manufacturing equipment for the semiconductor manufacturing process, on a basis of the equipment reliability index and the lot risk score excursion; and automatically determining, by the processor, whether to measure a semiconductor product which is processed in the semiconductor manufacturing equipment for the semiconductor manufacturing process and moved out of the semiconductor manufacturing equipment, on a basis of the lot risk score, wherein the measurement control device further includes a memory storing instructions executable by the processor to perform the dynamic lot measurement control algorithm, wherein the calculating of the equipment reliability index comprises:

calculating, by the processor, a process stability for the semiconductor manufacturing process by using the following equation: $S_{op}$=Min(Cpk, 1), Cpk=Min{(USL−m)/3σ, (m−LSL)/3σ}, wherein Min is a minimum value of listed values, m is a target value on process specifications, USL is a upper specification limit, LSL is a lower specification limit, and σ is a standard deviation, calculating, by the processor, an equipment stability for the semiconductor manufacturing equipment on a basis of $L_{cnt}$ and $L_{fdc}$, wherein $L_{fdc}$ is the number of times that FDC (Fault Detection and Classification) Interlock occurred during a predetermined previous time period, and calculating, by the processor, the equipment reliability index based on the process stability and the equipment stability, wherein the lot risk score excursion $L_{ex}$ is calculated based on $L_{m/o}/L_{avg}$, wherein $L_{avg}=L_{mes}/L_{cnt}$, wherein $L_{cnt}$ is the total number of lots processed in the semiconductor manufacturing equipment during the predetermined previous time period, $L_{mes}$ is the number of lots measured during the predetermined previous time period, and $L_{m/o}$ is the number of lots which are processed in the semiconductor manufacturing equipment and moved out of the semiconductor manufacturing equipment, but excluding lots which skipped from measurement, and $L_{avg}$ is an average ratio of the number of measured lots over the total number of processed lots, wherein the calculating of the lot risk score comprises calculating the lot risk score by using the following equation: Lot risk score=1−(the equipment reliability index×the lot risk score excursion $L_{ex}$), wherein the receiving of the process and equipment data, the calculating of the process stability, the calculating of the equipment stability, and the calculating of the equipment reliability index based on the process stability and the equipment stability are performed periodically by the processor based on the dynamic lot measurement control algorithm, and wherein the calculating of the lot risk score excursion $L_{ex}$, the calculating of the lot score risk based on the equipment reliability index and the lot risk score excursion $L_{ex}$, and the automatically determining of whether to measure the semiconductor product processed in the semiconductor manufacturing equipment and moved out of the semiconductor manufacturing equipment are performed by the processor based on the dynamic lot measurement control algorithm in real time whenever a semiconductor product is processed by the semiconductor manufacturing equipment and is moved out of the semiconductor manufacturing equipment.

2. The method of claim 1, wherein the equipment reliability index is calculated by using the following equation:

Equipment reliability index=Process stability×Equipment stability.

3. The method of claim 1, wherein the determining comprises determining to measure when the lot risk score reaches a reference value.

4. A measurement control system comprising a measurement device and a measurement control device, wherein the measurement device obtains process and equipment data regarding a semiconductor manufacturing equipment for a semiconductor manufacturing process in semiconductor manufacturing, wherein the measurement control device comprises:

a communication unit configured to receive the process and equipment data regarding the semiconductor manufacturing equipment for the semiconductor manufacturing process in the semiconductor manufacturing; and a processor configured to perform an automatic and dynamic lot measurement control method of the measurement control system in the semiconductor manufacturing based on a dynamic lot measurement control algorithm, wherein the processor is further configured to:

control the communication unit to receive the process and equipment data, based on the received process and equipment data, calculate an equipment reliability index of the semiconductor manufacturing equipment for the semiconductor manufacturing process in the semiconductor manufacturing, calculate a risk score excursion $L_{ex}$, calculate a lot risk score of the semiconductor manufacturing equipment for the semiconductor manufacturing process on a basis of the equipment reliability index and the risk score excursion, and automatically determine whether to measure a semiconductor product which is processed in the semiconductor manufacturing equipment for the semiconductor manufacturing process and moved out of the semiconductor manufacturing equipment on a basis of the lot risk score, wherein the measurement control device further includes a memory storing instructions executable by the processor to perform the dynamic lot measurement control algorithm, wherein the processor is further configured to:

calculate a process stability ($S_{op}$) for the semiconductor manufacturing process by using the following equation: $S_{op}$=Min(Cpk, 1), Cpk=Min{(USL−m)/3σ, (m−LSL)/3σ}, wherein Min is a minimum value of listed values, m is a target value on process specifications, USL is a upper specification limit, LSL is a lower specification limit, and σ is a standard deviation, calculate an equipment stability for the semiconductor manufacturing equipment on a basis of $L_{cnt}$ and $L_{fdc}$, wherein $L_{fdc}$ is the number of times that FDC (Fault Detection and Classification) Interlock occurred during a predetermined previous time period, and calculate the equipment reliability index based on the process stability and the equipment stability, wherein the lot risk score excursion $L_{ex}$ is calculated based on $L_{m/o}/L_{avg}$, wherein $L_{avg}=L_{mes}/L_{cnt}$, wherein $L_{cnt}$ is the total number of lots processed in the semiconductor manufacturing equipment during the predetermined previous time period, $L_{mes}$ is the number of lots measured during the predetermined previous time period, and $L_{m/o}$ is the number of lots which are processed in the semiconductor manufacturing equipment and moved out of the semiconductor manufacturing equipment, but excluding lots which skipped from measurement, $L_{avg}$ is an average ratio of the number of measured lots over the total number of processed lots, wherein the processor is further configured to calculate the lot risk score by using the following equation: Lot risk score=1−(the equipment reliability index×the lot risk score excursion $L_{ex}$), wherein the processor is further configured to perform the receiving of the process and equipment data, the calculating of the process stability, the calculating of the equipment stability and the calculating of the equipment reliability index based on the process stability and the equipment stability periodically based on the dynamic lot measurement control algorithm, and wherein the processor is further configured to perform the calculating of the lot risk score excursion $L_{ex}$, the calculating of the lot score risk based on the equipment reliability index and the lot risk score excursion $L_{ex}$, and the automatically determining of whether to measure the semiconductor product processed in the semiconductor manufacturing equipment and moved out of the semiconductor manufacturing equipment based on the dynamic lot measurement control algorithm in real time whenever a semiconductor product is processed by the semiconductor manufacturing equipment and is moved out of the semiconductor manufacturing equipment.

5. The measurement control system of claim 4, wherein the equipment reliability index is calculated by using the following equation:

Equipment reliability index=Process stability×Equipment stability.

6. The measurement control system of claim 4, wherein the processor is further configured to determine to measure when the lot risk score reaches a reference value.

7. The measurement control method of claim 1, wherein the lot risk score excursion $L_{ex}$ is calculated by using the following equation: $L_{ex}=\exp(-30\times L_{m/o}/L_{avg})$.

8. The measurement control system of claim 4, wherein the lot risk score excursion $L_{ex}$ is calculated by using the following equation: $L_{ex}=\exp(-30\times L_{m/o}/L_{avg})$.

* * * * *